United States Patent
Racz et al.

(10) Patent No.: US 8,535,984 B2
(45) Date of Patent: Sep. 17, 2013

(54) ELECTRONIC MODULES AND METHODS FOR FORMING THE SAME

(75) Inventors: Livia M. Racz, Belmont, MA (US); Gary B. Tepolt, Pelham, NH (US); Jeffrey C. Thompson, Charlestown, MA (US); Thomas A. Langdo, Cambridge, MA (US); Andrew J. Mueller, Medford, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 13/222,764

(22) Filed: Aug. 31, 2011

(65) Prior Publication Data

US 2011/0309528 A1   Dec. 22, 2011

Related U.S. Application Data

(63) Continuation of application No. 12/164,614, filed on Jun. 30, 2008, now Pat. No. 8,017,451.

(60) Provisional application No. 61/042,512, filed on Apr. 4, 2008.

(51) Int. Cl.
   *H01L 21/00* (2006.01)
(52) U.S. Cl.
   USPC ............... 438/118; 438/127; 257/E21.502
(58) Field of Classification Search
   USPC ....................................... 257/E21.5
   See application file for complete search history.

(56) References Cited

U.S. PATENT DOCUMENTS

| | | | |
|---|---|---|---|
| 3,742,597 A | 7/1973 | Davis | |
| 4,266,334 A | 5/1981 | Edwards et al. | |
| 4,735,679 A | 4/1988 | Lasky | |
| 4,800,419 A | 1/1989 | Long et al. | |
| 4,878,991 A | 11/1989 | Eichelberger et al. | |
| 4,897,708 A | 1/1990 | Clements | |
| 4,954,875 A | 9/1990 | Clements | |
| 4,961,806 A | 10/1990 | Gerrie et al. | |
| 5,004,498 A | 4/1991 | Shimamura et al. | |
| 5,008,213 A | 4/1991 | Kolesar, Jr. | |
| 5,108,825 A | 4/1992 | Wojnarowski et al. | |
| 5,111,278 A | 5/1992 | Eichelberger | |
| 5,144,747 A | 9/1992 | Eichelberger | |
| 5,162,260 A | 11/1992 | Leibovitz et al. | |
| 5,172,213 A | 12/1992 | Zimmerman | |

(Continued)

FOREIGN PATENT DOCUMENTS

| | | |
|---|---|---|
| EP | 0450950 | 10/1991 |
| EP | 1030369 | 8/2000 |

(Continued)

OTHER PUBLICATIONS

"3D Integration for Mixed Signal Applications," Ziptronix, Inc., Whitepaper, 2002, pp. 1-4.

(Continued)

*Primary Examiner* — Cheung Lee
(74) *Attorney, Agent, or Firm* — Edwards Wildman Palmer LLP; Ralph A. Loren

(57) ABSTRACT

Electronic modules are formed by encapsulating microelectronic dies within cavities in a substrate.

12 Claims, 9 Drawing Sheets

(56) References Cited

U.S. PATENT DOCUMENTS

| | | |
|---|---|---|
| 5,250,843 A | 10/1993 | Eichelberger |
| 5,298,288 A | 3/1994 | Curry, II et al. |
| 5,373,418 A | 12/1994 | Hayasi |
| 5,373,627 A | 12/1994 | Grebe |
| 5,471,366 A | 11/1995 | Ozawa |
| 5,480,842 A | 1/1996 | Clifton et al. |
| 5,640,044 A | 6/1997 | Takehashi et al. |
| 5,663,106 A | 9/1997 | Karavakis et al. |
| 5,745,984 A | 5/1998 | Cole, Jr. et al. |
| 5,766,986 A | 6/1998 | Weber et al. |
| 5,790,384 A | 8/1998 | Ahmad et al. |
| 5,831,833 A | 11/1998 | Shirakawa et al. |
| 5,831,836 A | 11/1998 | Long et al. |
| 5,841,193 A | 11/1998 | Eichelberger |
| 5,866,952 A | 2/1999 | Wojnarowski et al. |
| 5,981,312 A | 11/1999 | Farquhar et al. |
| 6,013,534 A | 1/2000 | Mountain |
| 6,017,822 A | 1/2000 | Mountain |
| 6,020,646 A | 2/2000 | Boyle et al. |
| 6,046,499 A | 4/2000 | Yano et al. |
| 6,081,997 A | 7/2000 | Chia et al. |
| 6,114,221 A | 9/2000 | Tonti et al. |
| 6,117,704 A | 9/2000 | Yamaguchi et al. |
| 6,168,970 B1 | 1/2001 | Burns |
| 6,203,967 B1 | 3/2001 | Westbrook et al. |
| 6,294,477 B1 | 9/2001 | Ho et al. |
| 6,307,751 B1 | 10/2001 | Bodony et al. |
| 6,333,252 B1 | 12/2001 | Jung et al. |
| 6,339,875 B1 | 1/2002 | Larson |
| 6,383,846 B1 | 5/2002 | Shen et al. |
| 6,414,585 B1 | 7/2002 | Marcoux et al. |
| 6,424,545 B2 | 7/2002 | Burton |
| 6,440,641 B1 | 8/2002 | Lykins et al. |
| 6,451,626 B1 | 9/2002 | Lin |
| 6,492,195 B2 | 12/2002 | Nakanishi et al. |
| 6,495,914 B1 | 12/2002 | Sekine et al. |
| 6,506,664 B1 | 1/2003 | Beyne et al. |
| 6,506,681 B2 | 1/2003 | Grigg et al. |
| 6,509,639 B1 | 1/2003 | Lin |
| 6,518,096 B2 | 2/2003 | Chan et al. |
| 6,544,638 B2 | 4/2003 | Fischer et al. |
| 6,548,326 B2 | 4/2003 | Kobayashi et al. |
| 6,562,660 B1 | 5/2003 | Sakamoto et al. |
| 6,730,533 B2 | 5/2004 | Durocher et al. |
| 6,756,305 B1 | 6/2004 | Conn |
| 6,762,074 B1 | 7/2004 | Draney et al. |
| 6,765,287 B1 | 7/2004 | Lin |
| 6,774,037 B2 | 8/2004 | Hussein et al. |
| 6,794,741 B1 | 9/2004 | Lin et al. |
| 6,833,628 B2 | 12/2004 | Brandenburg et al. |
| 6,833,986 B2 | 12/2004 | Marcoux et al. |
| 6,835,592 B2 | 12/2004 | Hall et al. |
| 6,838,313 B2 | 1/2005 | Kumamoto et al. |
| 6,861,336 B1 | 3/2005 | Hampton |
| 6,882,034 B2 | 4/2005 | Corisis et al. |
| 6,882,036 B2 | 4/2005 | Draney et al. |
| 6,884,717 B1 | 4/2005 | Desalvo et al. |
| 6,900,076 B2 | 5/2005 | Komiyama et al. |
| 6,902,953 B2 | 6/2005 | Haba |
| 6,910,268 B2 | 6/2005 | Miller |
| 6,936,491 B2 | 8/2005 | Partridge et al. |
| 6,943,067 B2 | 9/2005 | Greenlaw |
| 6,962,835 B2 | 11/2005 | Tong et al. |
| 6,967,124 B1 | 11/2005 | Huemoeller et al. |
| 7,005,319 B1 | 2/2006 | Chen et al. |
| 7,019,405 B2 | 3/2006 | Koike et al. |
| 7,037,755 B2 | 5/2006 | Enquist |
| 7,064,055 B2 | 6/2006 | Reif et al. |
| 7,067,354 B2 | 6/2006 | Prabhu |
| 7,067,911 B1 | 6/2006 | Lin et al. |
| 7,078,790 B2 | 7/2006 | Haba |
| 7,084,494 B2 | 8/2006 | Coyle et al. |
| 7,109,092 B2 | 9/2006 | Tong |
| 7,122,447 B2 | 10/2006 | Abe et al. |
| 7,129,110 B1 | 10/2006 | Shibata |
| 7,129,113 B1 | 10/2006 | Lin et al. |
| 7,138,295 B2 | 11/2006 | Leedy |
| 7,157,372 B1 | 1/2007 | Trezza |
| 7,169,691 B2 | 1/2007 | Doan |
| 7,250,677 B1 | 7/2007 | Lin |
| 7,253,109 B2 | 8/2007 | Ding et al. |
| 7,262,082 B1 | 8/2007 | Lin et al. |
| 7,271,033 B2 | 9/2007 | Lin et al. |
| 7,271,482 B2 | 9/2007 | Kirby |
| 7,291,518 B2 | 11/2007 | Kim |
| 7,291,543 B2 | 11/2007 | Grigg et al. |
| 7,292,381 B1 | 11/2007 | Patterson et al. |
| 7,341,938 B2 | 3/2008 | Enquist |
| 7,344,959 B1 | 3/2008 | Pogge et al. |
| 7,388,277 B2 | 6/2008 | Pogge et al. |
| 7,425,499 B2 | 9/2008 | Oliver et al. |
| 7,453,150 B1 | 11/2008 | McDonald |
| 7,563,648 B2 | 7/2009 | Islam et al. |
| 7,642,137 B2 | 1/2010 | Lin et al. |
| 7,687,724 B2 | 3/2010 | Das et al. |
| 7,727,806 B2 | 6/2010 | Uhland et al. |
| 7,935,559 B1 | 5/2011 | Giffard et al. |
| 7,960,247 B2 | 6/2011 | Thompson et al. |
| 8,017,451 B2 | 9/2011 | Racz et al. |
| 2002/0076851 A1 | 6/2002 | Eden et al. |
| 2002/0137253 A1 | 9/2002 | Guida |
| 2003/0045072 A1 | 3/2003 | Jiang |
| 2003/0060034 A1 | 3/2003 | Beyne et al. |
| 2003/0070517 A1 | 4/2003 | Tsujimoto |
| 2003/0201530 A1 | 10/2003 | Kurihara et al. |
| 2004/0009649 A1 | 1/2004 | Kub et al. |
| 2004/0048039 A1 | 3/2004 | Hornung |
| 2004/0070083 A1 | 4/2004 | Su |
| 2004/0097054 A1 | 5/2004 | Abe |
| 2004/0145051 A1 | 7/2004 | Klein et al. |
| 2004/0157435 A1 | 8/2004 | Park |
| 2004/0174223 A1 | 9/2004 | Achyut |
| 2004/0203188 A1 | 10/2004 | Draney et al. |
| 2005/0017333 A1 | 1/2005 | Bohr |
| 2005/0093170 A1 | 5/2005 | Kalidas et al. |
| 2005/0104177 A1 | 5/2005 | Lin et al. |
| 2005/0112798 A1 | 5/2005 | Bjorbell |
| 2006/0046350 A1 | 3/2006 | Jiang et al. |
| 2006/0063312 A1 | 3/2006 | Kurita |
| 2006/0264006 A1* | 11/2006 | Kian et al. .................. 438/464 |
| 2006/0270104 A1 | 11/2006 | Trovarelli et al. |
| 2006/0275941 A1 | 12/2006 | Oliver et al. |
| 2007/0057284 A1 | 3/2007 | Casey et al. |
| 2007/0080458 A1 | 4/2007 | Ogawa et al. |
| 2007/0090513 A1 | 4/2007 | Kuo et al. |
| 2007/0108610 A1 | 5/2007 | Kondo |
| 2007/0254411 A1 | 11/2007 | Uhland et al. |
| 2008/0001268 A1 | 1/2008 | Lu |
| 2008/0036087 A1 | 2/2008 | Jacobsen et al. |
| 2008/0042250 A1 | 2/2008 | Wilson et al. |
| 2008/0050916 A1 | 2/2008 | Yonker et al. |
| 2008/0054494 A1 | 3/2008 | Chen et al. |
| 2008/0076209 A1 | 3/2008 | Klink et al. |
| 2008/0239683 A1 | 10/2008 | Brodsky et al. |
| 2008/0280435 A1 | 11/2008 | Klootwijk et al. |
| 2008/0290490 A1 | 11/2008 | Fujii et al. |
| 2008/0290494 A1 | 11/2008 | Lutz et al. |
| 2008/0315398 A1 | 12/2008 | Lo et al. |
| 2009/0004785 A1 | 1/2009 | Chiu et al. |
| 2009/0250249 A1 | 10/2009 | Racz et al. |
| 2009/0250823 A1 | 10/2009 | Racz et al. |
| 2009/0251879 A1 | 10/2009 | Thompson et al. |
| 2010/0164079 A1 | 7/2010 | Dekker et al. |

FOREIGN PATENT DOCUMENTS

| | | |
|---|---|---|
| EP | 1152464 | 11/2001 |
| EP | 1432033 | 6/2004 |
| JP | 61-039534 A | 2/1986 |
| JP | 2004-349603 A | 12/2004 |
| WO | WO-98/20559 | 5/1998 |
| WO | WO-99/25019 | 5/1999 |
| WO | WO-01/06563 | 1/2001 |
| WO | WO-2005/048302 A2 | 5/2005 |
| WO | WO-2008/030665 | 3/2008 |

OTHER PUBLICATIONS

"3D System Integration" [online] Brochure, Fraunhofer Institut, prgr THRD Jun. 1-3. [retrieved Feb. 14, 2011]. Retrieved from the Internet: <http://www.izm.fraunhofer.de/fhg/Images/3d_2010_tcm358-86441.pdf>, 16 pages.

"Benefits of 3D Integration in Digital Imaging Applications," Ziptronix, Inc., Whitepaper, 2000, pp. 1-3.

"Data Sheet: Wafer Level Packaging," Amkor Technology, Dec. 2005, DS720A, 2 pages.

"Technology Profile Fact Sheet: Wafer and Die Thinning Technology" [online]. National Security Agency, Central Security Service [retrieved Feb. 6, 2008]. Retrieved via the Internet: <http://www.nsa.gov/techtrans/techt00058.cfm>, 2 pages.

Aull et al. "Laser Radar Imager Based on 3D Integration of Geiger-Mode Avalanche Photodiodes with Two SOI Timing Circuit Layers," 2006 IEEE International Solid-State Circuits Conference, 2006, 10 pages.

Burns et al. "A Wafer-Scale 3-D Circuit Integration Technology," IEEE Transaction on Electron Devices, 53:10, Oct. 2006, pp. 2507-16.

Cobb et al. "Process Considerations for Manufacturing 50 µm Thinned III-V Wafers" [online]. CS MANTECH Conference, May 14-17, 2007, Austin, Texas, USA, pp. 21-23. [retrieved Apr. 2, 2008]. Retrieved from the Internet: <http://www.gaasmantech.com/Digests/2007/2007%20Papers/02a.pdf>, 3 pages.

Cooke "Low Power Mobile DRAM and PSRAM for Mobile Applications." JEDEC Presentation to CES 2007.

Fusaro "Packaging Solutions for Mobile Applications," Amkor Technology presentation to JEDEC/CES, Jan. 9, 2007, 45 pages.

Gann "Neo-Stacking Technology," HDI Magazine, Dec. 1999, 4 pages.

Garrou "Integrated Passives . . . . Are We There Yet?" Semiconductor International, Oct. 1, 2005, 4 pages.

Garrou, "Wafer-Level 3-D Integration Moving Forward," Semiconductor International, Oct. 1, 2006, 4 pages.

Gurnett et al. "Ultra-Thin Semiconductor Wafer Applications and Processes" [online]. III-Vs Review, vol. 19, Issue 4, May 2006, pp. 38-40, [retrieved Feb. 6, 2008]. Retrieved from the Internet: <http://www.sciencedirect.com/science?_ob=ArticleURL&_udi=B6VM5-4K77FTN-1R&_user=2502287&_rdoc=1&_fmt=&_orig=search&_sort=d&view=c&_acct=C000055109&_version=1&_urlVersion=0&_userid=2502287&md5=1403c25b9264197f5d7c82e0256d59a3>, 6 pages.

Huffman "50 Micron Pitch Flip Chip Bumping Technology: Processes and Applications," IEEE Components, Packaging & Manufacturing Technology Society, 2006, 32 pages.

Kohl et al. "Low Cost Chip Scale Packaging and Interconnect Technology," Proceedings of the Surface Mount International Conference, Sep. 1997, 7 pages.

Koyanagi et al. "Neuromorphic Vision Chip Fabricated Using Three-Dimensional Integration Technology," 2001 IEEE International Solid-State Circuits Conference, 2001, 3 pages.

LoPiccolo, "Mapping Progress in 3D IC Integration," Solid State Technology, 2007, 3 pages.

Peters "Deep Silicon Etching Gets Ready for 3-D ICs," Semiconductor International, Sep. 1, 2006, pp. 1-5.

Pogge "Realizing Effective SOCs: From Planar 20 to Viable 3D ICs," IBM Microelectronics, 2004, 62 pages.

Quddus "JEDEC and Memory Standardization," 2007, 20 pages.

Singer "3-D Die Interconnect Forecast," Semiconductor International, Nov. 1, 2006, 1 page.

Singer et al. "Cost Considerations for CSP Variations," Presented at Chip Scale International, May 1998, pp. 1-9.

Souriau "Wafer Level Processing of 3D System in Package for RF and Data Applications," 2005 IEEE Electronic Components and Technology Conference, 2005, pp. 356-361.

Suntharalingarn et al. "Megapixel CMOS Image Sensor Fabricated in Three-Dimensional Integrated Circuit Technology," 2005 IEEE International Solid-State Circuits Conference, 2005, pp. 356-357.

Topper et al. "The Wafer-Level Packaging Evolution," Semiconductor International, Oct. 1, 2004, 6 pages.

Vitkavage, "Making the Business Case for 3D," Future Fab International, vol. 22, Jan. 9, 2007, 8 pages.

Warner et al. "An Investigation of Wafer-to-Wafer Alignment Tolerances for Three-Dimensional Integrated Circuit Fabrication," SOI Conference, 2004, Proceedings, 2004 IEEE International, Oct. 4-7, 2004, 2 pages.

Warner et al. "Layer Transfer of FDSOI CMOS to 150mm InP Substrates for Mixed-Material Integration," Indium Phosphide and Related Materials Conference Proceedings, 2006 International Conference on, Jun. 6, 2006, pp. 226-228.

Yarema "Fermilab Initiatives in 3D Integrated Circuits and SOI Design for HEP," ILC Vertex Workshop, May 29-31, 2006, 38 pages.

International Search Report for PCT Application No. PCT/US2007/010659, mailed Nov. 7, 2007, 2 pages.

Written Opinion for PCT Application No. PCT/US2007/010659, mailed Nov. 7, 2007, 5 pages.

Partial International Search Report for PCT Application No. PCT/2009/039453, mailed Jul. 22, 2009.

International Search Report and Written Opinion for PCT Application No. PCT/US2009/039453, mailed Sep. 9, 2009.

Partial International Search Report for PCT Application No. PCT/US2009/039450, mailed Jul. 22, 2009, 5 pages.

International Search Report for PCT Application No. PCT/US2009/039450, mailed Sep. 9, 2009, 5 pages.

Written Opinion for PCT Application No. PCT/US2009/039450, mailed Sep. 9, 2009, 13 pages.

Examination Report for European Patent Application No. 09727616.6, mailed May 13, 2011, 4 pages.

Carta et al. "Design and Implementation of Advanced Systems in a Flexible-Stretchable Technology for Biomedical Applications" Sensors and Actuators A 156 (2009) 79-87.

Gierow et al. "Processes and Materials for Flexible PV Arrays" 2002 37th Intersociety Energy Conversion Engineering Conference (IECEC) Paper No. 20120.

Thompson "Integrated Ultra High Density Multi-Chip Module Packaging Design" Tufts University Thesis Paper, May 2008.

Vieroth et al. "Stretchable Circuit Board Technology and Application" Technische Universitat Berlin, pp. 33-36, 2009.

Examination Report for European Patent Application No. 09727616.6, mailed May 4, 2012, 4 pages.

International Search Report and Written Opinion for PCT Application No. PCT/US2011/055144, mailed May 23, 2012, 12 pages.

International Search Report and Written Opinion for PCT Application No. PCT/US2011/055077, mailed Jun. 5, 2012, 9 pages.

Keser "Redistributed Chip Packaging," Semiconductor Packaging, Apr. 2007, vol. 30, No. 4, 9 pages.

Takahashi et al. "Development of Advanced 3D Chip Stacking Technology with Ultra-Fine Interconnection," IEEE 2001 Electronic Components and Technology Conference, May 29, 2011, 6 pages.

* cited by examiner

ELECTRONIC MODULES AND METHODS FOR FORMING THE SAME

RELATED APPLICATIONS

This application is a continuation of, and claims priority to and the benefit of, U.S. patent application Ser. No. 12/164,614, which was filed on Jun. 30, 2008 and which itself claims the benefit of and priority to U.S. Provisional Patent Application No. 61/042,512, filed Apr. 4, 2008, the entire disclosures of which are both hereby incorporated herein by reference.

FIELD OF THE INVENTION

The present invention relates, in various embodiments, to the construction and fabrication of high density heterogeneous electronic modules.

BACKGROUND

High density electronic modules have been designed and fabricated to satisfy the increasing demand for high levels of functionality in small packages. Products that may be made from the modules include memory, digital logic, processing devices, and analog and RF circuits. Typically, the integration density of electronic modules is many times greater than surface mount technology ("SMT") is capable of achieving, but less than an application specific integrated circuit ("ASIC"). However, for low volume production, these modules offer an alternative to ASIC devices, as they require less set-up cost and development time. Moreover, modules may be optimized for particular applications that demand multiple functions—for example, a pre-fabricated microelectronic die optimum for each desired function is selected, and the multiple dies are then interconnected and packaged together to form the module. Often, the pre-fabricated dies will have different form factors and thicknesses, making attempts to package them together in a single module problematic. Additional difficulties may arise when attempting to vertically interconnect different layers of dies together in a single module, as the requisite processing may damage the dies in each layer.

The fabrication of electronic modules typically features pre-thinned microelectronic dies simply positioned on an adhesive-coated substrate. A custom-machined spacer is then placed over and between the dies in order to provide a planar surface for further processing, including metal deposition, patterning, and interconnection. A thin dielectric layer is often laminated (via application of high pressure) over the dies and spacer to provide the requisite isolation between the dies and the metal interconnects. Vias to the die pads (i.e., the conductive contact pads connecting to the inner circuitry of the die) are then laser drilled and filled with a conductive material. Although high integration density may be achieved using this method, there are certain limitations. For example, dies thinned to less than 100 μm, e.g., approximately 35 μm or less, might not survive the high pressure used for lamination. Furthermore, the dies that are used typically cannot be thinned after they are placed on the module substrate, limiting the module thicknesses that may be achieved. Another limitation of this method is the use of laser-drilled vias, which are typically limited in diameter to approximately 40 μm. This puts constraints on die pad sizes, which restricts design choices to certain devices. In addition, spacing between dies must typically be greater than the via diameter to allow deep via formation. Finally, deep, high-aspect-ratio vias are often difficult to reliably and repeatably fill with the conductive material (as is required to interconnect multiple layers in a module).

Thus, in order to service the demand for increasingly small microelectronic systems, improved systems and methods for constructing high-density electronic modules are needed.

SUMMARY

In accordance with certain embodiments, a technique is provided for forming high-density electronic modules that include encapsulated dies and reliable interlayer and/or intradie interconnections. The dies are preferably encapsulated with a bipartite structure that includes a dielectric layer protecting the active device surface and an encapsulant surrounding the rest of the device. Moreover, posts are preferably simultaneously formed with cavities that contain the die. These posts form at least a portion of electrical connections between dies or across a single die.

In one aspect, embodiments of the invention feature a method for constructing an electronic module. The method includes forming at least one fill hole in a first side of a substrate and a cavity in a second side of the substrate. The cavity is in fluidic communication with the fill hole, and a die is positioned within the cavity. An encapsulant is injected through the fill hole into the cavity to encapsulate the die. The die may be disposed on a dielectric layer that is disposed over the second side of the substrate such that the die is within the cavity.

Embodiments of the invention may include one or more of the following. At least one post may be formed within the cavity, and the post may be formed during cavity formation. Forming the post may include positioning a via chip within the cavity, and the via chip may include a matrix disposed around the post. The matrix may include silicon and the post may include a metal, e.g., copper. Forming the via chip may include defining a hole through the thickness of the matrix and forming a metal within the hole to form the post.

A conductive material may be formed over the post and the interior surface of the cavity. The encapsulated die may be electrically connected to a second die, and at least a portion of the electrical connection may include the post. At least one layer of conductive interconnections may be formed over the second side of the substrate. At least a portion of the first side of the substrate may be removed to expose at least a portion of the die, and at least one layer of conductive interconnects may be formed over the exposed portion of the die. A handle wafer may be disposed over the second side of the substrate prior to removing at least a portion of the first side of the substrate. A temporary bonding material may be formed over the handle wafer prior to disposing it over the second side of the substrate. The encapsulated die may be individuated.

In another aspect, embodiments of the invention feature an electronic module that includes a die encapsulated within each of a plurality of cavities in a substrate. At least one post defines at least a portion of an electrical connection through the substrate. The post and the substrate may include the same material, which may be a semiconductor material. The die may be encapsulated by an encapsulant and a dielectric layer, which may include different materials. The encapsulant may include a filled polymer and the dielectric layer may include an unfilled polymer. Each die may have a surface that is substantially coplanar with a surface of each other die. A conductive material may be disposed over at least the lateral surfaces of the post.

In yet another aspect, embodiments of the invention feature a structure that includes a substrate defining at least one fill hole and a cavity in fluidic communication with the fill hole. The fill hole is in a first side of the substrate and the cavity is in a second side of the substrate. A die is at least partially encapsulated within the cavity by an encapsulant. A dielectric layer may be disposed over the cavity and in contact with the die. A plurality of fill holes may be in fluidic communication with the cavity.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
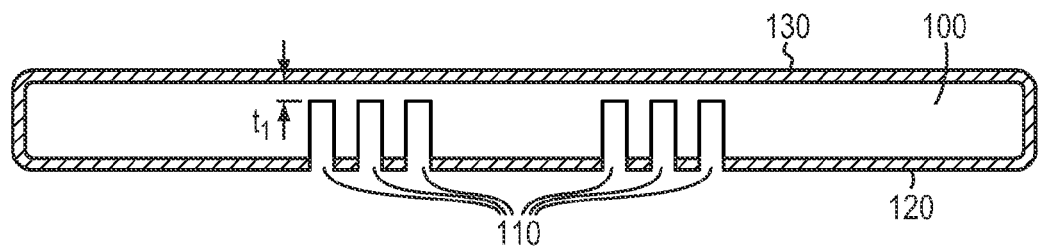
FIGS. 1A-1C are cross-sectional views of an exemplary embodiment of a processed substrate utilized to fabricate electronic modules.

Referring to FIG. 1A, a substrate 100 is provided with one or more fill holes 110 formed in its back surface 120. Substrate 100 preferably includes or consists essentially of a rigid and/or non-conductive material, e.g., glass or a semiconductor such as silicon. In an embodiment, substrate 100 includes or consists essentially of at least one unmoldable and uncurable material. At least a portion of substrate 100 forms the support structure for a high-density electronic module containing multiple microelectronic dies, as further described below. In an embodiment, substrate 100 is a silicon wafer with a dielectric layer disposed on at least back surface 120 and a front surface 130. The dielectric layer may be an oxide, e.g., silicon dioxide, and may have a thickness of approximately 1 µm. Fill holes 110 are preferably formed in substrate 100 by forming a protective layer (not shown), e.g., photoresist, over front surface 130 and back surface 120, e.g., by a spin-on process. The protective layer on back surface 120 is then patterned, e.g., by conventional masked photolithography, such that areas of back surface 120 where fill holes 110 are to be fabricated are substantially free of the protective layer. Fill holes 110 are subsequently formed by, e.g., plasma or wet etching. In a preferred embodiment, fill holes 110 do not completely penetrate to front surface 130 of substrate 100, and have a depth in the range of approximately 200 µm to approximately 400 µm. The remaining thickness $t_1$ between the bottoms of fill holes 110 and front surface 130 may be approximately 150 µm. In an embodiment, each fill hole 110 has a diameter of approximately 1 mm.

Figure 1B:
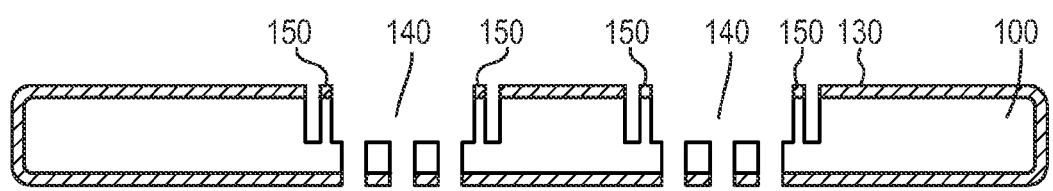
Figure 1C:
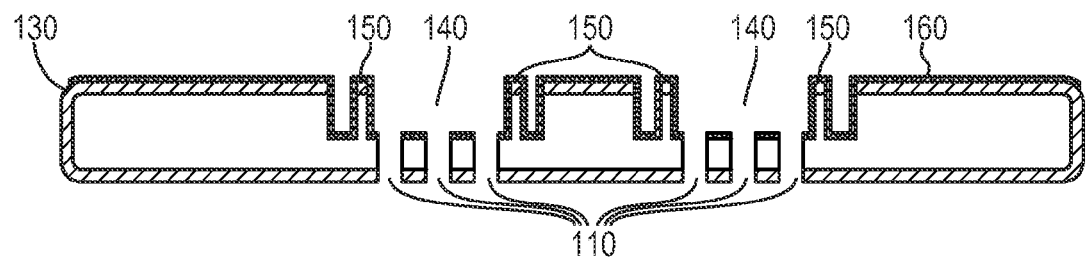

Referring to FIGS. 1B and 1C, at least one cavity 140 is formed in front surface 130 of substrate 100. The depth of each cavity 140 may be approximately 100 µm to approximately 250 µm, and is preferably sufficient to 1) fluidically connect cavity 140 with fill holes 110 and 2) substantially contain a microelectronic die 200 (as further described below). Each cavity 140 is preferably in fluidic communication with multiple fill holes 110 (e.g., between approximately 25 and 36, or even up to approximately 100), but may also be in fluidic communication with as few as ten, five, or even one fill hole 110. Cavity 140 may be formed by, e.g., conventional masked photolithography and etching. Within each cavity 140, at least one post 150 may be formed, the height of which is substantially equal to the depth of cavity 140. Each post 150 may be formed during formation of cavity 140, e.g., simultaneously via the same etch process. Each post 150 may be roughly cylindrical in shape and have a diameter of approximately 10 µm to approximately 35 µm. In other embodiments, each post is non-pyramidal, i.e., has approximately the same diameter throughout its thickness, and/or is in the shape of a prism with a roughly square or rectangular cross-section. In a preferred embodiment, each post 150 remains rigidly connected (at one end) and includes or consists essentially of the same material as substrate 100 and/or a non-metallic material. In a preferred embodiment, each post 150 includes or consists essentially of a semiconductor material such as silicon. In another embodiment, each post 150 includes or consists essentially of a metal such as copper. As illustrated in FIG. 1C, a layer of conductive material 160 may be formed over front side 130 of substrate 100, preferably coating at least all lateral sides of each post 150 and the internal surfaces of each cavity 140. Conductive material 160 may include or consist essentially of a metal such as copper, and may have a thickness between approximately 0.5 µm and approximately 7 µm, or even greater than approximately 7 µm. In an embodiment, the thickness of conductive material 160 is approximately 3 µm. In an embodiment, a portion of conductive material 160 (which may be a "seed portion" for electroplating) is formed by physical deposition, e.g., sputtering or evaporation, and a remaining portion is formed by electroplating. The physically deposited portion of conductive material 160 may include or consist essentially of approximately 200 nm of copper over approximately 100 nm of titanium, and the electroplated portion may include or consist essentially of approximately 3 μm of copper. In another embodiment, substantially all of conductive material 160 is formed by physical deposition. If desired, conductive material 160 may be sintered, thus reacting it with the material of post 150 to convert at least a portion of post 150 into a conductive alloy (e.g., a metal silicide). In a preferred embodiment, even after formation of conductive material 160 to metalize posts 150, posts 150 are not entirely formed of a metal. In various embodiments, conductive material 160 formed within cavities 140 is not removed, at least not until a suitable thinning process is performed (as described below).

Figure 1D:
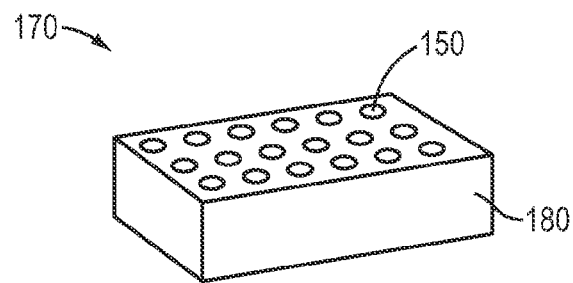
FIG. 1D is a perspective view of an exemplary embodiment of a via chip containing interconnection posts.
Figure 1E:
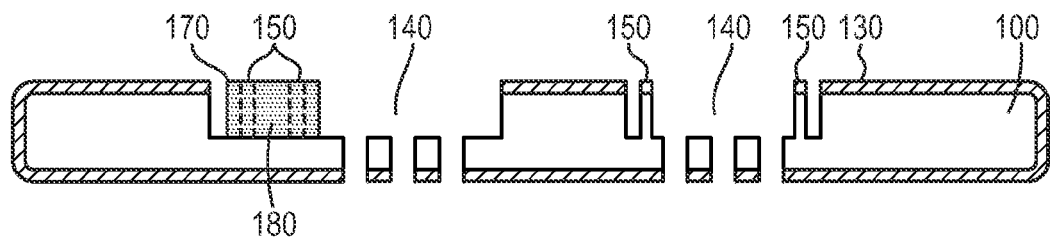
FIG. 1E is a cross-sectional view of an exemplary embodiment of a processed substrate including the via chip of FIG. 1D.

Referring to FIGS. 1D and 1E, in various embodiments, one or more posts 150 are not formed by etching of substrate 100. In such embodiments, one or more posts 150 may be pre-formed in a via chip 170. Via chip 170 may include or consist essentially of a matrix 180 within which one or more posts 150 are formed. Matrix 180 may include or consist essentially of a dielectric material or a semiconductor material, e.g., silicon. Posts 150 preferably extend through the entire thickness of via chip 170. Via chip 170 may be fabricated by forming one or more holes through matrix 180, e.g., by etching. The one or more holes may be at least substantially filled (or have their interior surfaces coated) by a conductive material (e.g., a metal) to form post(s) 150. The conductive material may be formed by, e.g., electroplating and/or physical vapor deposition. In this manner, one or more posts 150 may be formed in via chip 170 by a process resembling a through-silicon via (TSV) process. Via chip 170 may be introduced into cavity 140 and encapsulated as described below with reference to microelectronic die 200.

Figure 2:
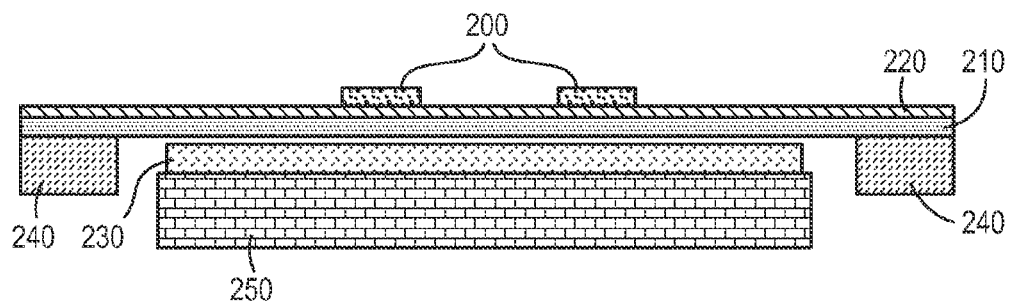
FIG. 2 is a cross-sectional view of an exemplary apparatus for the mounting and aligning of microelectronic dies.

FIG. 2 depicts an exemplary apparatus for the mounting and aligning of microelectronic dies to the substrate 100, e.g., within the cavities 140 of the substrate 100. As illustrated in FIG. 2, a plurality of microelectronic dies 200 are disposed over a film 210, although, more generally, as few as a single microelectronic die 200 may be disposed over the film 210. In an embodiment, one microelectronic die 200 is disposed over film 210 for each cavity 140 prepared in substrate 100 as described above. Each microelectronic die 200 may include or consist essentially of at least one semiconductor material such as Si, GaAs, or InP, and may be a bare die or a packaged die. In an embodiment, at least one microelectronic die 200 is a packaged assembly of multiple devices, e.g., a hermetically packaged sensor and/or microelectromechanical systems (MEMS) device. In various embodiments, each microelectronic die 200 is a microcontroller, a central processing unit, or other type of chip utilized in various electronic components such as sensors or computers. Microelectronic dies 200 may have non-uniform thicknesses, and may differ in size and shape—because the microelectronic dies 200 may be encapsulated in cavities 140 as described below, individually tailored recesses or plinths may not be required for cavities 140 to be suitable to contain a wide range of different microelectronic dies 200. In a preferred embodiment, a dielectric layer 220 is disposed between and in contact with each microelectronic die 200 and film 210. Dielectric layer 220 may have a thickness of approximately 10 μm, and may be formed on film 210 by a spin-on process. In various embodiments of the invention, dielectric layer 220 includes or consists essentially of an unfilled polymer, e.g., a negative-toned spin-on material such as one of the various Intervia Photodielectrics (available from Rohm and Haas Company of Philadelphia, Pa.) or the SINR 3100 series (available from Shin-Etsu MicroSi, Inc. of Phoenix, Ariz.). A first surface of each microelectronic die 200, which typically contains circuitry fabricated thereon, is in contact with film 210 or dielectric layer 220.

In a preferred embodiment, dielectric layer 220 is a good electrical insulator, forms uniform coatings over uneven surfaces, and is relatively transparent. Dielectric layer 220 may be initially formed on film 210 as a liquid. In one embodiment, dielectric layer 220 is capable of being used to produce coatings or films with uniform thickness using equipment typically employed in fabrication of semiconductor devices. Initial heat treatments of dielectric layer 220 may allow it to become "tacky," or at least mildly adhesive. Further heat treatments may ultimately cure/crosslink dielectric layer 220 such that it becomes a rigid structural material.

In one embodiment, dielectric layer 220 is selected for its sensitivity to light (i.e., it is photosensitive or photoimageable). Thus, areas of dielectric layer 220 may be removed by standard photolithographic methods, e.g., prior to being fully cured. In another embodiment, dielectric layer 220 is not sensitive to light. In such a case, dielectric layer 220 may be patterned using mechanical methods such as masking, machining, deep reactive ion etching (DRIE), or ablation with a laser, before or after it is fully cured.

In order to facilitate accurate placement of microelectronic dies 200, film 210 may be placed over die placement mask 230 containing features corresponding to the pattern of cavities 140 and posts 150 defined on substrate 100. Film 210 and dielectric layer 220 are preferably at least partially transparent, and, as such, the microelectronic dies 200 may be placed on dielectric layer 220 in locations defined on the die placement mask 230 thereunder. Film 210 may include or consist essentially of a substantially transparent material (e.g., Mylar or Kapton), and it (and dielectric film 220 thereover) may be supported around its perimeter by an alignment ring 240. In an embodiment, alignment ring 240 includes or consists essentially of a rigid material such as a metal. Die placement mask 230, film 210, and dielectric layer 220 are preferably heated by a heated platen 250 disposed below die placement mask 240 to a temperature of approximately 60° C. to approximately 100° C. The elevated temperature softens dielectric layer 220 such that, as each microelectronic die 200 is placed in a desired location (dictated by the pattern on die placement mask 230), it adheres to dielectric layer 220. Once in contact with dielectric layer 220, the front, active surfaces of microelectronic dies 200 may be approximately coplanar, within ±2 μm. The front surfaces of microelectronic dies may be substantially coated, i.e., "sealed," by dielectric layer 220.

Figure 3:
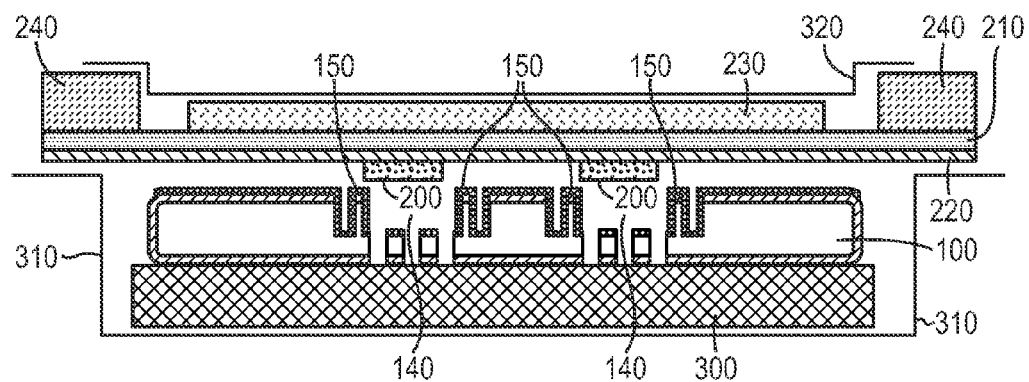
FIG. 3 is a cross-sectional view of microelectronic dies being introduced into the substrate of FIG. 1C in accordance with one embodiment of the invention.
Figure 4:
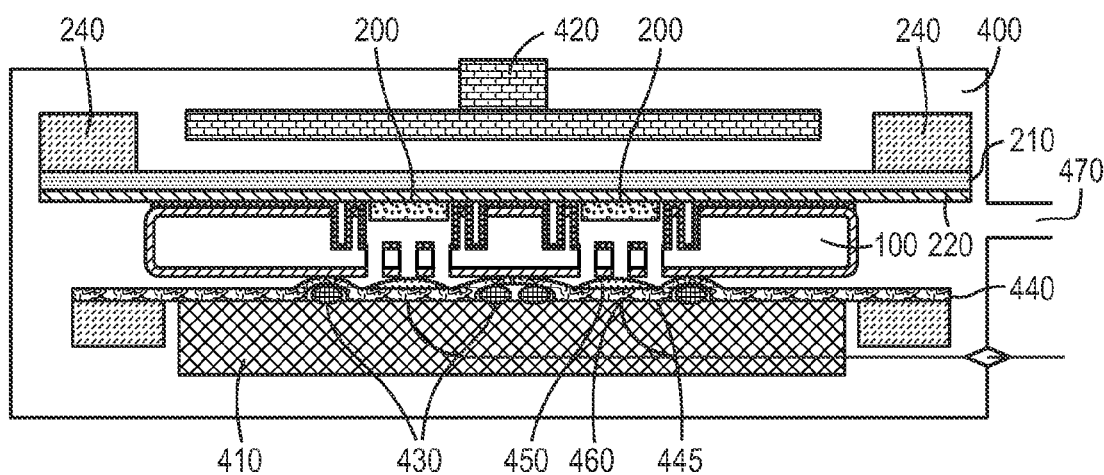
FIG. 4 is a cross-sectional view of an encapsulation apparatus utilized to encapsulate microelectronic dies in accordance with embodiments of the invention.

Referring to FIG. 3, microelectronic dies 200 adhered to dielectric layer 220 may be placed over and aligned to cavities 140 in substrate 100. Posts 150 may be utilized as alignment marks, thus facilitating accurate alignment of microelectronic dies 200 to cavities 140. Substrate 100 is disposed over a hotplate 300 and within a diaphragm 310. Once microelectronic dies 200 are aligned to cavities 140, alignment ring 240 is lowered such that dielectric layer 220 contacts a surface of substrate 100 and microelectronic dies 200 are substantially disposed within cavities 140. A substantial vacuum may be drawn in the space between film 210 and substrate 100 (now "sealed" due to the contact between diaphragms 310, 320) such that dielectric film 220 preferably (and substantially uniformly) contacts a top surface of substrate 100 and posts 150. Thus, dielectric film 220 "seals" microelectronic dies 200 within cavities 140, as shown in FIG. 4. In an embodiment, microelectronic dies 200 adhere to dielectric film 220 within cavities 140, but not to an internal surface of cavities 140.

Referring to FIG. 4, an encapsulation chamber 400 may be utilized to encapsulate the microelectronic dies 200 within cavities 140. Substrate 100, now adhered to dielectric film 220 (which itself is disposed on film 210 and alignment ring 240) is placed within encapsulation chamber 400. Additionally disposed within encapsulation chamber 400, on opposing sides of substrate 100, are platen 410 and pressure plate 420. At least one o-ring 430 is disposed over platen 410, and film 440 is disposed over platen 410 and o-rings 430, thus forming pockets 445. Each pocket 445 may contain encapsulant 450. Platen 410 preferably includes or consists essentially of a rigid material, e.g., a metal, and is heatable. O-rings 430 may include or consist essentially of an elastomeric material such as silicone, and film 440 may include or consist essentially of Teflon. Platen 410 also includes holes 460 suitable for the conduction of compressed gas (e.g., compressed air), as described further below. The introduction of compressed gas through holes 460 applies pressure to the back surface of film 440 in pockets 445, and film 440 may deflect in response to the applied pressure. Encapsulation chamber 400 also includes vacuum port 470 connected to a vacuum pump (not shown) that enables the evacuation of encapsulation chamber 400.

In an exemplary embodiment, microelectronic dies 200 are encapsulated according to the following steps. First, platen 410 is heated to approximately 30° C. and encapsulation chamber 400 is evacuated for approximately 5 minutes in order to out-gas encapsulant 450. The vacuum in encapsulation chamber 400 also substantially prevents the formation of trapped air bubbles in cavities 140 during encapsulation of microelectronic dies 200 (as described below). Fill holes 110 are aligned above pockets 445, and force is applied to pressure plate 420 in order to seal the back surface of substrate 100 to o-rings 430 covered with film 440. A pressure of approximately 15 pounds per square inch (psi) is applied to the back surface of film 440 via the introduction of compressed gas through holes 460, thus forcing encapsulant 450 through fill holes 110 into cavities 140. Dielectric film 220, supported by pressure plate 420, at least substantially prevents the flow of encapsulant 450 between microelectronic dies 200 and dielectric film 220, maintaining the substantial coplanarity of the top surfaces of microelectronic dies 200. The pressure is applied for approximately 5 minutes, whereupon the pressure is reduced to, e.g., approximately 1 psi. Platen 410 is heated to approximately 60° C. for a time period sufficient to at least substantially cure encapsulant 450, e.g., approximately 4 hours. As encapsulant 450 cures, its volume may be reduced, and the pressure applied to film 440 is sufficient to inject additional encapsulant 450 into cavities 140. Thus, cavities 140 are continuously filled with encapsulant 450 during curing, ensuring that cavities 140 are substantially or completely filled with encapsulant 450 after curing. Substrate 100 is then removed from encapsulation chamber 400, and excess encapsulant 450 present on the back surface of substrate 100 may be removed by, e.g., scraping with a razor blade and/or application of a suitable solvent. Curing may be continued at a temperature of approximately 60° C. for a period of approximately 3 hours to approximately 5 hours. Film 210 is then removed from substrate 100, leaving dielectric layer 220 substantially or completely intact. After removal of film 210, the exposed surface of dielectric layer 220 is preferably planar to within ±2 μm. The presence of dielectric layer 220 over microelectronic dies 200 preferably maintains this planarity even after introduction of encapsulant 450, obviating the need to separately planarize encapsulant 450 and/or microelectronic dies 200 after encapsulation. In other embodiments, other techniques are utilized to introduce encapsulant 450 into cavities 140. For example, a syringe, an injection-molding screw, or a piston pump may be utilized to introduce encapsulant 450 into cavities 140 through fill holes 110.

In an exemplary embodiment, encapsulant 450 includes or consists essentially of a filled polymer such as molding epoxy. The filler may reduce the thermal expansion of the polymer, and may include or consist essentially of minerals, e.g., quartz, in the form of particles, e.g., spheres, having characteristic dimensions, e.g., diameters, smaller than approximately 50 μm. Encapsulant 450 may be an insulating material having a coefficient of thermal expansion (CTE) approximately equal to the CTE of silicon. Encapsulant 450 may be present in pockets 445 in the form of a paste or thick fluid, or in the form of a powder that melts upon application of pressure thereto. Subsequent processing may cure/crosslink encapsulant 450 such that it becomes substantially rigid. In various embodiments, encapsulant 450 includes or consists essentially of a heavily filled material such as Shin-Etsu Semicoat 505 or SMC-810.

As described above, encapsulant 450 and dielectric layer 220 may cooperatively encapsulate microelectronic dies 200. Encapsulation by multiple materials may be preferred, as encapsulant 450 (which is molded around the majority of each microelectronic die 200) and dielectric layer 220 (which coats the surface of each microelectronic die 200 containing active circuitry) may advantageously have different material properties and/or methods of processing. Encapsulant 450 may wet to and bond directly to dielectric layer 220, thereby forming a substantially seamless interface.

Figure 5A:
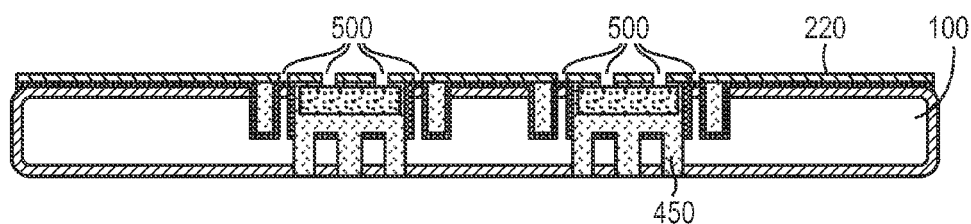
FIGS. 5A-5C are cross-sectional views of the formation of contacts to encapsulated microelectronic dies in accordance with one embodiment of the invention.
Figure 5B:
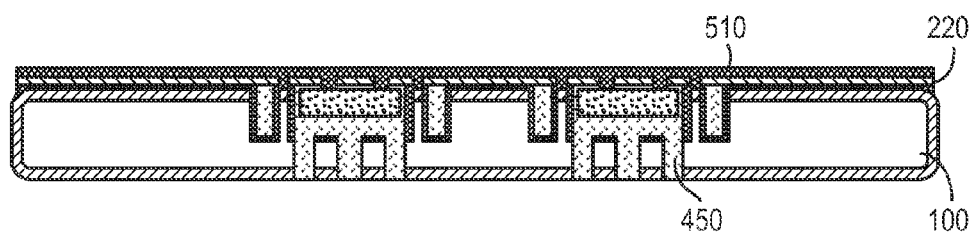
Figure 5C:
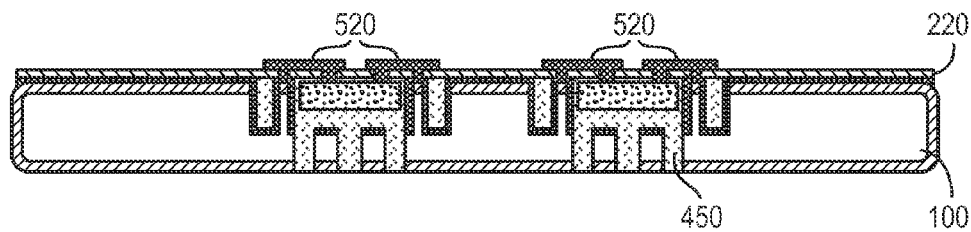

Referring to FIGS. 5A-5C, conductive connections to metalized posts 150 and to contact pads on the surface of microelectronic dies 200, as well as a first metallization layer, may be formed according to the following exemplary steps. First, dielectric layer 220, which is preferably photosensitive, is patterned by, e.g., conventional masked photolithography, to form via holes 500. Prior to patterning, dielectric layer may have been soft baked at approximately 90° C. for approximately 60 seconds. Via holes 500 may have a diameter between approximately 5 μm and approximately 20 μm. Patterned dielectric layer 220 is then subjected to a hard bake of approximately 190° C. for approximately 1 hour, after which it is substantially planar to within ±2 μm. As illustrated in FIG. 5B, conductive material 510 is subsequently formed over dielectric layer 220, coating and substantially or completely filling via holes 500 (thus forming conductive vias therein). Conductive material 510 may include or consist essentially of a metal such as copper, and may have a thickness between approximately 0.5 μm and approximately 7 μm, or even greater than approximately 7 μm. In an embodiment, a portion of conductive material 510 (which may be a "seed portion" for electroplating) is formed by physical deposition, e.g., sputtering or evaporation, and a remaining portion is formed by electroplating. In various embodiments, the electroplated portion may be omitted, i.e., substantially all of conductive material 510 is formed by physical deposition. The physically deposited portion of conductive material 510 may include or consist essentially of approximately 200 nm to approximately 2000 nm of copper over approximately 100 nm of titanium, and the electroplated portion may include or consist essentially of approximately 3 μm to approximately 7 μm of copper. Conductive material 510 may also include a capping layer of approximately 100 nm of titanium that may be formed by, e.g., a physical deposition method such as sputtering. The filling of via holes 500 with conductive material 510 is facilitated by the fact that via holes 500 only extend through the thickness of dielectric layer 220, whereupon at least some via holes 500 reach metalized posts 150. This arrangement obviates the need for the filling of high-aspectratio vias for the subsequent formation of interconnections on or near the back side of microelectronic dies 200 (after substrate thinning as described below), which may be difficult in many circumstances. As illustrated in FIG. 5C, conductive material 510 is patterned by, e.g., conventional masked photolithography and etching (e.g., wet or plasma etching) to form interconnection layer 520. In a preferred embodiment, conductive material 510 is etched by application of a commercially available metal etchant such as ferric chloride or chromic acid. After etching, interconnection layer 520 preferably includes conductive lines with a minimum linewidth of less than approximately 12.5 µm, or even less than approximately 5 µm.

Figure 6A:
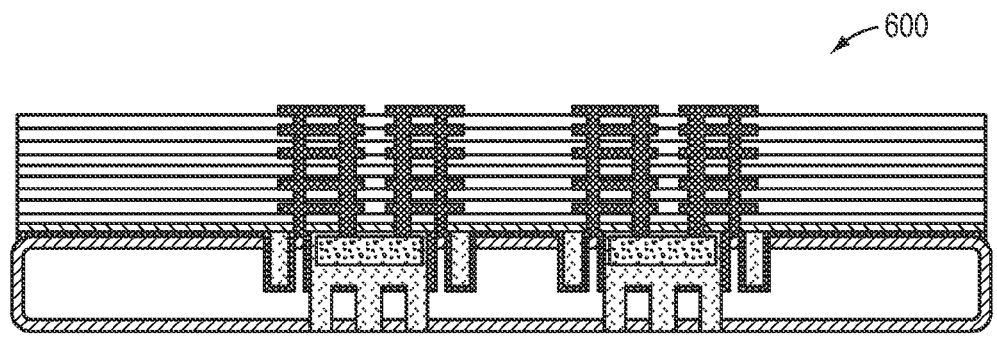
FIGS. 6A and 6B are cross-sectional views of full-thickness substrate layers of an electronic module with multiple layers of interconnects in accordance with one embodiment of the invention.
Figure 6B:
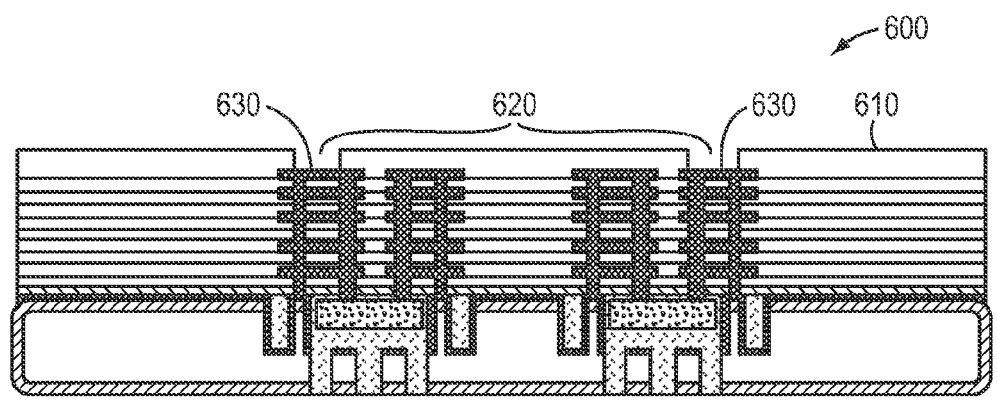

Referring to FIG. 6A, after formation of interconnection layer 520, another dielectric film (which may be substantially identical to dielectric layer 220) may be deposited thereover, and the steps described above with reference to FIGS. 5A-5C may be repeated once or even multiple times. The resulting pre-thinned module layer 600 includes a desired number and arrangement of metal interconnection layers. Referring to FIG. 6B, a solder mask 610 may be formed over pre-thinned module layer 600 and patterned by, e.g., conventional masked photolithography. Solder mask 610 may include or consist essentially of a photosensitive dielectric material, e.g., those described above with reference to dielectric layer 220. Openings 620 in solder mask may be later utilized to form, e.g., solder ball connections to topmost interconnection layer 630.

Figure 7A:
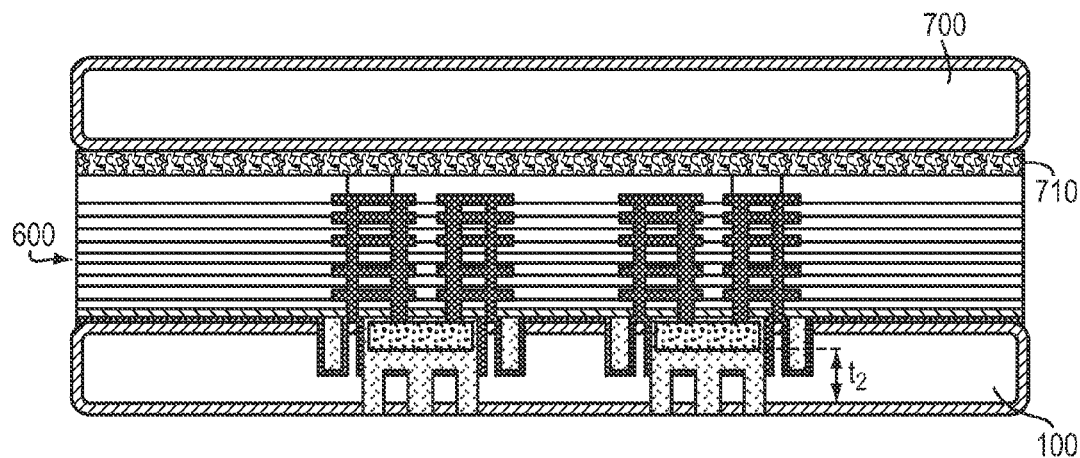
FIG. 7A is a cross-sectional view of a full-thickness substrate module layer attached to a handle wafer in accordance with one embodiment of the invention.
Figure 7B:
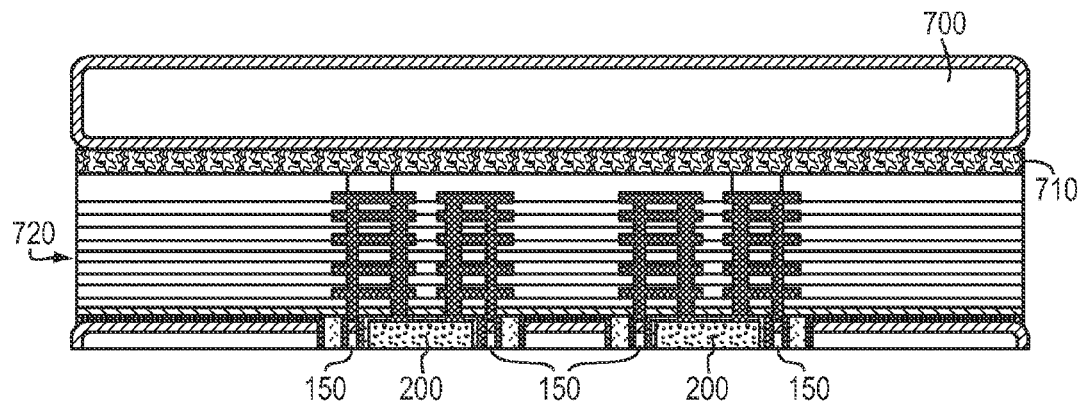
FIG. 7B is a cross-sectional view of the module layer of FIG. 7A after a thinning process.

Referring to FIGS. 7A and 7B, in various embodiments of the invention, a handle wafer 700 is wafer bonded to pre-thinned module layer 600 according to the following steps. A temporary bonding material 710 is formed over pre-thinned module layer 600 by, e.g., a spin-on or silk-screen process. Temporary bonding material 710 may include or consist essentially of, e.g., WaferBOND or WaferBOND HT-250 (both available from Brewer Science, Inc. of Rolla, Mo.). In an embodiment, temporary bonding material 710 is applied to handle wafer 700 by spinning it on at a rate of approximately 1000 to approximately 3500 rpm. Temporary bonding material 710 may then be baked at a temperature of approximately 170° C. to approximately 220° C. for a time of approximately 7 minutes. Handle wafer 700 may then be brought into contact with pre-thinned module layer 600 utilizing, e.g., an EVG 501 wafer bonding tool (available from EV Group E. Thallner GmbH of Austria). The wafer bonding process may include applying a pressure of approximately 15 psi to handle wafer 700 and pre-thinned module layer 600, as well as applying an elevated temperature (between approximately 140° C. and approximately 220° C.) thereto. Handle wafer 700 may include or consist essentially of glass, or may be a semiconductor (e.g., silicon) wafer having a dielectric layer (e.g., an oxide such as silicon dioxide) formed thereover.

After handle wafer 700 is bonded to a first surface of pre-thinned module layer 600, a thinning process may be performed, as illustrated in FIG. 7B, on a second, opposing side of pre-thinned module layer 600. During thinning, a thickness $t_2$ (illustrated in FIG. 7A) of pre-thinned module layer 600 is preferably removed, thus exposing (or even removing) at least a portion of a bottom surface of encapsulated microelectronic dies 200 and at least a portion of metalized posts 150. Microelectronic dies 200 and posts 150 remain in their desired locations, as they are encapsulated in encapsulant 450. The thinning process may include or consist essentially of mechanical grinding or lapping, e.g., on a copper lapping plate, with a polishing slurry, e.g., diamond particles suspended in a liquid such as water. In an embodiment, an exposed surface of thinned module layer 720 thus formed is further smoothed by, e.g., chemical-mechanical polishing.

After removal of thickness $t_2$ of pre-thinned module layer 600, each post 150 preferably forms at least a substantial portion of an electrical connection through substrate 100. As further described below, this connection may be utilized as an intradie interconnect (e.g., connecting the front and back sides of microelectronic die 200) and/or as an interconnect to further layers of microelectronic dies in an electronic module.

Figure 8A:
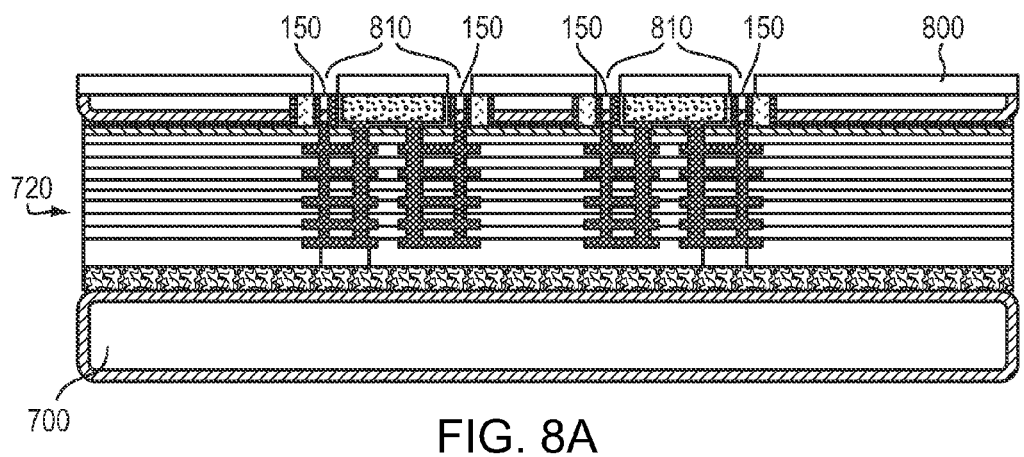
FIGS. 8A-8C are cross-sectional views of the fabrication of back side contacts and interconnects on a thinned microelectronic module layer in accordance with one embodiment of the invention.
Figure 8B:
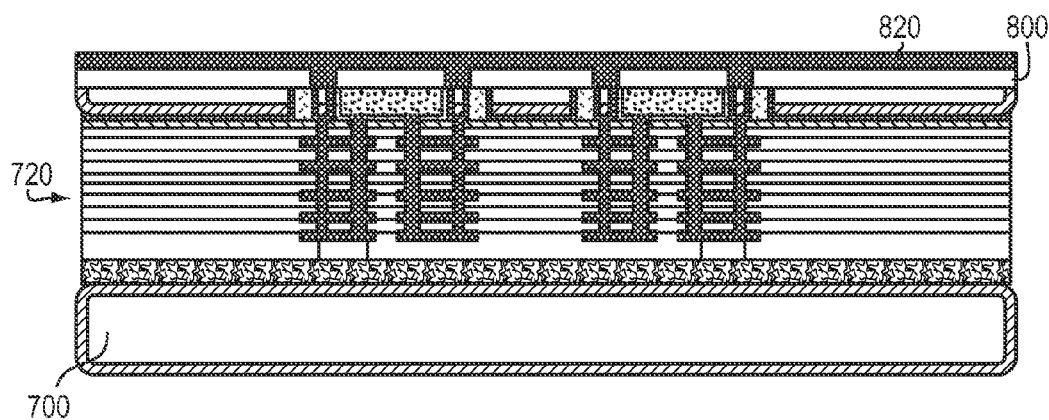
Figure 8C:
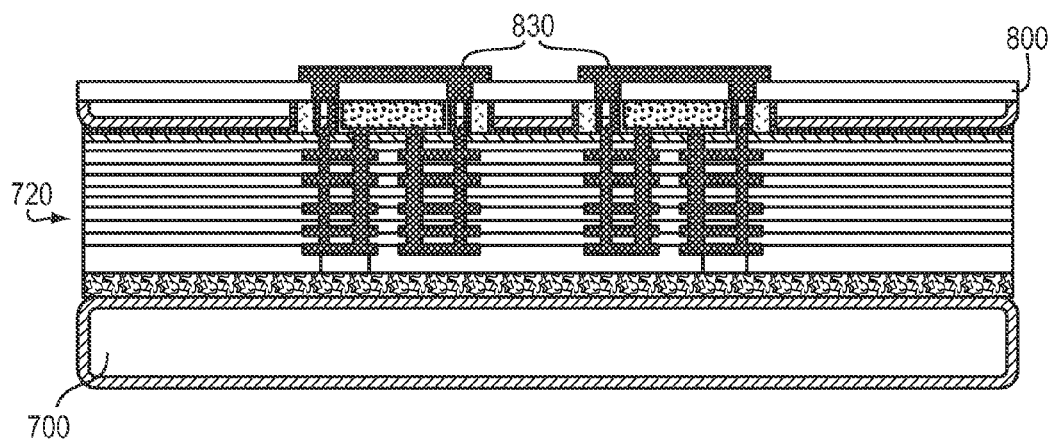

Referring to FIGS. 8A-8C, conductive backside connections to metalized posts 150, as well as a first backside metallization layer, may be formed according to the following exemplary steps. First, dielectric layer 800, which is preferably photosensitive (and may include or consist essentially of materials described above for dielectric layer 220), is patterned by, e.g., conventional masked photolithography, to form backside via holes 810. Each backside via hole 810 may have a diameter of approximately 20 µm. As illustrated in FIG. 8B, conductive material 820 is subsequently formed over dielectric layer 800, substantially or completely filling backside via holes 810 (thus forming conductive vias therein). Conductive material 820 may include or consist essentially of a metal such as copper, and may have a thickness between approximately 0.5 µm and approximately 7 µm, or even greater than approximately 7 µm. In an embodiment, a portion of conductive material 820 (which may be a "seed portion" for electroplating) is formed by physical deposition, e.g., sputtering or evaporation, and a remaining portion is formed by electroplating. In various embodiments, the electroplated portion may be omitted, i.e., substantially all of conductive material 820 is formed by physical deposition. The physically deposited portion of conductive material 820 may include or consist essentially of approximately 200 nm to approximately 2000 nm of copper over approximately 100 nm of titanium, and the electroplated portion may include or consist essentially of approximately 3 µm to approximately 7 µm of copper. Conductive material 820 may also include a capping layer of approximately 100 nm of titanium that may be formed by, e.g., a physical deposition method such as sputtering. As described above with respect to via holes 500, connections through backside via holes 810 are facilitated by the presence of metalized posts 150, which obviate the need for high-aspect-ratio via filling. As illustrated in FIG. 8C, conductive material 820 is patterned by, e.g., conventional masked photolithography and etching (e.g., wet or plasma etching) to form backside interconnection layer 830. In a preferred embodiment, conductive material 820 is etched by application of a commercially available metal etchant such as ferric chloride or chromic acid. After etching, backside interconnection layer 830 preferably includes conductive lines with a minimum linewidth of less than approximately 12.5 µm, or even less than approximately 5 µm.

Figure 9A:
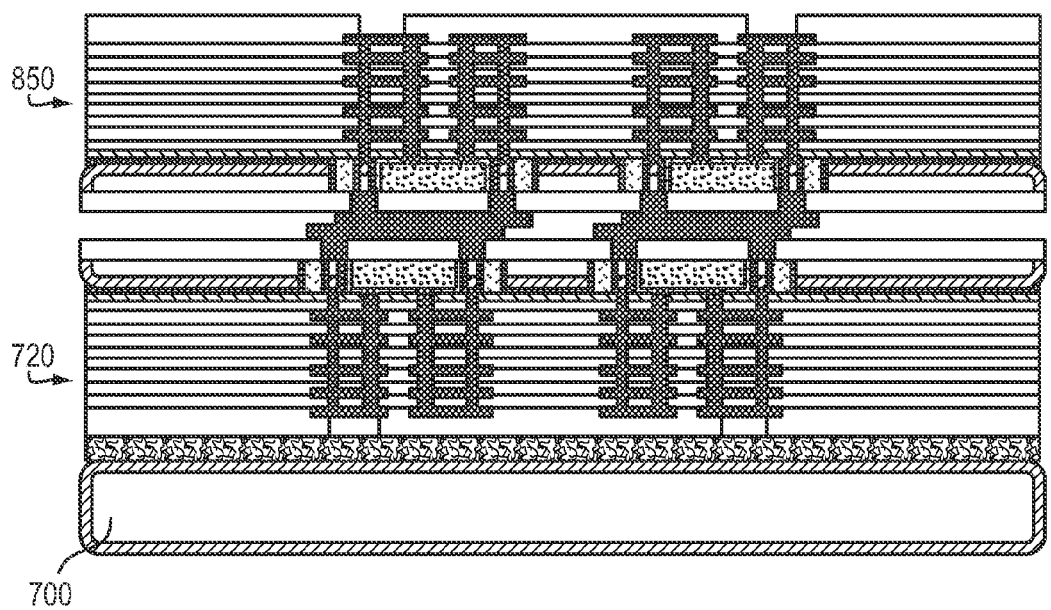
FIG. 9A is a cross-sectional view of multiple thinned module layers connected together in accordance with one embodiment of the invention.
Figure 9B:
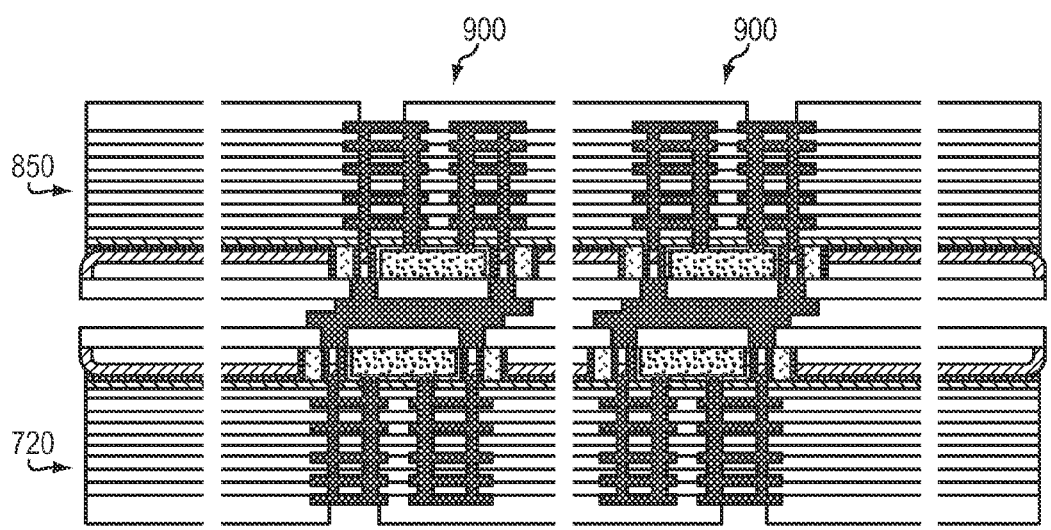
FIG. 9B is a cross-sectional view of individuated microelectronic modules fabricated in accordance with embodiments of the invention.

Thinned module layer 720 with backside interconnection layer 830 may optionally be connected to a second, similarly processed, thinned module layer 850 by, e.g., bonding the backside interconnection layers of each module 720, 850 together, as shown in FIG. 9A. The handle wafer of the second module layer 850 (not shown) may be removed, and another (or multiple) module layer(s) may be connected to the exposed surface of the second module layer 850. In a preferred embodiment, each additional module layer includes at least one microelectronic die that is encapsulated prior to attachment to thinned module layer 720. As illustrated in FIG. 9B, after a desired number (which may be none) of additional module layers is connected to thinned module layer 720, modules 900 may be individuated from the stacked module layers by, e.g., die sawing. Posts 150 may interconnect front and back surfaces of microelectronic dies 200 or may form interdie interconnections within each module 900. Handle wafer 700 may be removed either before or after individuation of modules 900. Removal of handle wafer 700 may be accomplished by heating to a suitable debonding temperature (which may be approximately 130° C. to approximately 250° C., depending on the selected temporary bonding material 710), and sliding away handle wafer 700. Modules 900 may then be suitably cleaned and utilized in any of a variety of applications, including ultra-miniature sensors, space applications with mass and size restrictions, fully integrated MEMS-complementary metal-oxide-semiconductor (MEMS-CMOS) structures, and implantable biological sensors. Microelectronic dies 200 within modules 900 may include analog or digital integrated circuits, digital signal processors, wireless communication components such as radio frequency receivers and transmitters, optical signal processors, optical routing components such as waveguides, biological and chemical sensors, transducers, actuators, energy sources, MEMS devices, and/or passive components such as resistors, capacitors, and inductors.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for electrically connecting a plurality of microelectronic dies, the method comprising:
    disposing the plurality of microelectronic dies on a single adhesive layer in a plurality of positions, each die thereafter having at least one exposed surface, the plurality of positions determined at least in part by a die placement mask located near the microelectronic dies;
    placing the adhesive layer in contact with a substrate having a first side and a second side, the second side comprising a plurality of cavities, the cavities located at a plurality of positions corresponding to the positions of the microelectronic dies so as to receive the microelectronic dies;
    applying an encapsulant over the exposed surfaces of the microelectronic dies so as to encapsulate each microelectronic die;
    removing at least a portion of the adhesive layer from each microelectronic die; and thereafter forming at least one electrical connection between at least two of the microelectronic dies.

2. The method of claim 1 further comprising curing the applied encapsulant over a period of time.

3. The method of claim 1 further comprising:
    forming a plurality of fill holes in the first side of the substrate, each cavity being in fluidic communication with at least one fill hole; and
    applying the encapsulant by injecting it through the fill holes.

4. The method of claim 3 further comprising forming at least one post within at least one of the cavities.

5. The method of claim 4, wherein the post is formed during formation of the cavity.

6. The method of claim 5, wherein both the post and the cavity are formed by etching the substrate.

7. The method of claim 4, wherein the post and the substrate each comprise the same material.

8. The method of claim 4, wherein the post and the substrate each comprise a semiconductor material.

9. The method of claim 8, wherein the post and the substrate each comprise silicon.

10. The method of claim 4 further comprising forming a conductive material over the post and an interior surface of the cavity.

11. The method of claim 10, wherein at least a portion of the electrical connection comprises the post.

12. The method of claim 1, wherein the adhesive layer comprises a dielectric material.

* * * * *